(12) United States Patent
Chiu

(10) Patent No.: US 8,179,189 B2
(45) Date of Patent: May 15, 2012

(54) TRIMMING CIRCUIT

(75) Inventor: Chao-Wen Chiu, Tainan County (TW)

(73) Assignee: Himax Analogic, Inc., Tainan (TW)

( * ) Notice: Subject to any disclaimer, the term of this patent is extended or adjusted under 35 U.S.C. 154(b) by 210 days.

(21) Appl. No.: 12/721,758

(22) Filed: Mar. 11, 2010

(65) Prior Publication Data

US 2011/0221501 A1      Sep. 15, 2011

(51) Int. Cl.
*H01H 37/76* (2006.01)
(52) U.S. Cl. ........................................................ 327/525
(58) Field of Classification Search .................. 327/308, 327/524, 525
See application file for complete search history.

(56) References Cited

U.S. PATENT DOCUMENTS

| | | | |
|---|---|---|---|
| 5,767,732 A * | 6/1998 | Lee et al. | 327/525 |
| 6,346,845 B1 * | 2/2002 | Choi | 327/525 |
| 7,098,722 B2 * | 8/2006 | Shih et al. | 327/525 |
| 7,362,159 B2 * | 4/2008 | Fukuda | 327/525 |
| 7,532,057 B2 * | 5/2009 | Aipperspach et al. | 327/525 |

* cited by examiner

*Primary Examiner* — Jeffrey Zweizig
(74) *Attorney, Agent, or Firm* — J.C. Patents

(57) ABSTRACT

A trimming circuit is provided. The trimming circuit had at least a trimming cell, and each of the at least trimming cell includes three current paths and a fuse. A first one of the current paths is interrupted when a second one of the current paths is uninterrupted, and the first one of the current paths is uninterrupted when the second one of the current paths is interrupted. When a trimming control signal is at an enable state, a third one of the current paths is uninterrupted, such that the fuse is blown. Based on the status of the fuse, the trimming circuit is capable of trimming an output voltage or an output current of an electric apparatus.

17 Claims, 17 Drawing Sheets

US 8,179,189 B2

TRIMMING CIRCUIT

BACKGROUND OF THE INVENTION

1. Field of Invention

The invention relates generally to trimming circuit and, more particularly, the invention relates to trimming circuit for trimming a packaged IC chip.

2. Description of Related Art

During the fabricating processes of an integrated circuit (IC), electrical characteristics of the IC may drift due to the deviations of the processes. For example, the output voltage is originally intended to be 1.3V, but finally may be measured to be 1.35V or 1.25V due the deviations of the process. The drift of electrical characteristics causes uncertainties in designing the circuits. Therefore, in order to eliminate factors causing electrical drift, besides the continuous progress on the manufacturing process of IC, the trimming technique can be adopted to adjust the drifted electrical characteristics.

The conventional trimming technique includes a current trim or a laser trim method. For example, in the laser trim technique, a laser beam is used to cut at least one wire of the circuit to be trimmed. The electrical characteristics of the circuit to be trimmed are adjusted by cutting some wire and leaving the other(s). However, it is acquired additional equipment to perform laser-cut trimming for the IC, and thus the hardware cost is increased. Moreover, the electrical characteristics may be further drifted after the circuits being packaged as an IC chip. And the conventional trimming technique is not applicable to the packaged IC chip.

Refer to FIG. 1. FIG. 1 is a block diagram of a conventional packaged IC chip 50. The conventional packaged IC chip 50 has a plurality of pads 52 and a core circuit 54. The core circuit 54 is packaged in the IC chip 50 and electrically connected to the pads 52. Since the core circuit 54 is packaged, it is difficult to adjust the drifted electrical characteristics of the core circuit 54.

SUMMARY OF THE INVENTION

The present invention provides a trimming circuit to trim an electric apparatus, such that the characteristics of the electric apparatus could be adjusted conveniently even if the electric apparatus is a packaged IC chip.

Other objects and advantages of the present invention can be further illustrated by the technical features broadly embodied and described as follows.

In order to achieve one or a portion of or all of the objects or other objects, one embodiment of the present invention provides a trimming circuit. The trimming circuit comprises at least a trimming cell. Each of the at least trimming cell includes a driving unit, a first current path, a second current path, a third current path, and a fuse. The driving unit is capable of receiving an input signal and a trimming control signal. The first current path includes a first switch and a second switch coupled in series, the first current path coupled between a system voltage and the fuse. The second current path includes a third switch, and the second current path is coupled between the system voltage and a connection node of the first switch and the second switch of the first current path. The third current path is coupled between the system voltage and the fuse. The first switch, the second switch and the third switch are turned on/off according to the input signal.

In an embodiment of the present invention, when the input signal is at a first state, the first switch and the second switch are turned off, and the third switch of the second current path is turned on.

In an embodiment of the present invention, the third current path includes a fourth switch, and when the input signal is at the first state and the trimming control signal is at an enable state, the fourth switch of the third current path is turned on to blow the fuse.

In an embodiment of the present invention, when the input signal is at a second state, the first switch and the second switch are turned on, and the third switch is turned off.

In an embodiment of the present invention, an output terminal of the trimming circuit is coupled to the connection node of the first switch and the second switch of the first current path, and a voltage level of the output terminal is at the first state when the input signal is at the first state and the fuse is not blown.

In an embodiment of the present invention, an output terminal of the trimming circuit is coupled to the connection node of the first switch and the second switch of the first current path, and a voltage level of the output terminal is at the second state when the input signal is at the second state and the fuse is not blown.

In an embodiment of the present invention, an output terminal of the trimming circuit is coupled to the connection node, and a voltage level of the output terminal is at the first state when the fuse is blown.

In an embodiment of the present invention, the driving unit comprises a second inverter, a first inverter, and a NOR gate. The second inverter includes an input terminal and an output terminal, and the output terminal coupled to the first switch. The first inverter is adapted to receive the input signal, and the first inverter includes an output terminal coupled to the input terminal of the second inverter, the second switch and the third switch. The NOR gate includes two input terminals for receiving the trimming control signal and the inverted input signal, and an output terminal coupled to the fourth switch.

In an embodiment of the present invention, each of the first switch, the third switch and the fourth switch is a PMOS transistor, and the second switch is an NMOS transistor.

In an embodiment of the present invention, the first current path further comprises a current source coupled between the system voltage and the first switch.

In an embodiment of the present invention, the third current path further comprises a resistor coupled between the fourth switch and the fuse.

In an embodiment of the present invention, the at least a trimming cell comprises a first trimming cell and a second trimming cell. The trimming circuit further comprises a current source, a first resistor, and a plurality of voltage adjusters. The first resistor is coupled to the current source to provide a trimming voltage. The plurality of voltage adjusters are adapted to for adjust the trimming voltage. The voltage adjusters are cascaded, and each of the voltage adjusters has a second resistor and a transistor coupled to the second resistor in parallel. A gate of the transistor of a first voltage adjuster of the voltage adjusters is coupled to an output terminal of the first trimming cell, and a gate of the transistor of a second voltage adjuster of the voltage adjusters is coupled to an output terminal of the second trimming cell.

In an embodiment of the present invention, the trimming circuit further comprises a first inverter, a second inverter and a third inverter. The first inverter is coupled between the output terminal of the first trimming cell and the gate of the transistor of the first voltage adjuster. The third inverter is coupled to the second inverter in series. The gate of the transistor of the second voltage adjuster of the voltage adjusters is coupled to the output terminal of the second trimming cell via the second inverter and the third inverter.

In an embodiment of the present invention, the at least a trimming cell comprises a plurality of trimming cells. The trimming circuit further comprises a plurality of adjusters and a resistor. Each of the adjusters comprises a first current source and a fifth switch. The fifth switch of each of the adjusters is controlled in response to variations of an output voltage of a corresponding one of the trimming cells. The resistor is coupled to the adjusters for providing a trimming voltage.

In an embodiment of the present invention, each of the adjusters is coupled to a second current source and a sixth switch, the second current source is coupled to the sixth switch in series, and the sixth switch is controlled by the output voltage of a corresponding one of the trimming cells, such that a corresponding fifth switch is controlled in response to variations of the output voltage of the corresponding one of the trimming cells.

In an embodiment of the present invention, the at least a trimming cell comprises a plurality of trimming cells. The trimming circuit further comprises a plurality of adjusters and a current mirror. Each of the adjusters comprises a first current source and a fifth switch. The fifth switch of each of the adjusters is controlled in response to variations of an output voltage of a corresponding one of the trimming cells. The current mirror is coupled to the adjusters for providing a trimming current. The trimming current is adjusted based on a current of the current mirror received form the first current sources.

In an embodiment of the present invention, each of the adjusters is coupled to a second current source and a sixth switch. The second current source is coupled to the sixth switch in series, and the sixth switch is controlled by the output voltage of a corresponding one of the trimming cells, such that a corresponding fifth switch is controlled in response to variations of the output voltage of the corresponding one of the trimming cells.

Based on the description above, a desired value of a trimming voltage or a trimming current could be determined previously before the operation of trimming the circuit to be trimmed. After the desired value of the trimming voltage or the trimming current is determined, the trimming control signal is used to blow the fuse(s) to fix the trimming voltage or the trimming current to be the desired value. Therefore, even if the circuit to be trimmed has been packaged as an IC chip, the electrical characteristics of the circuit to be trimmed could be modified by using the trimming circuit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
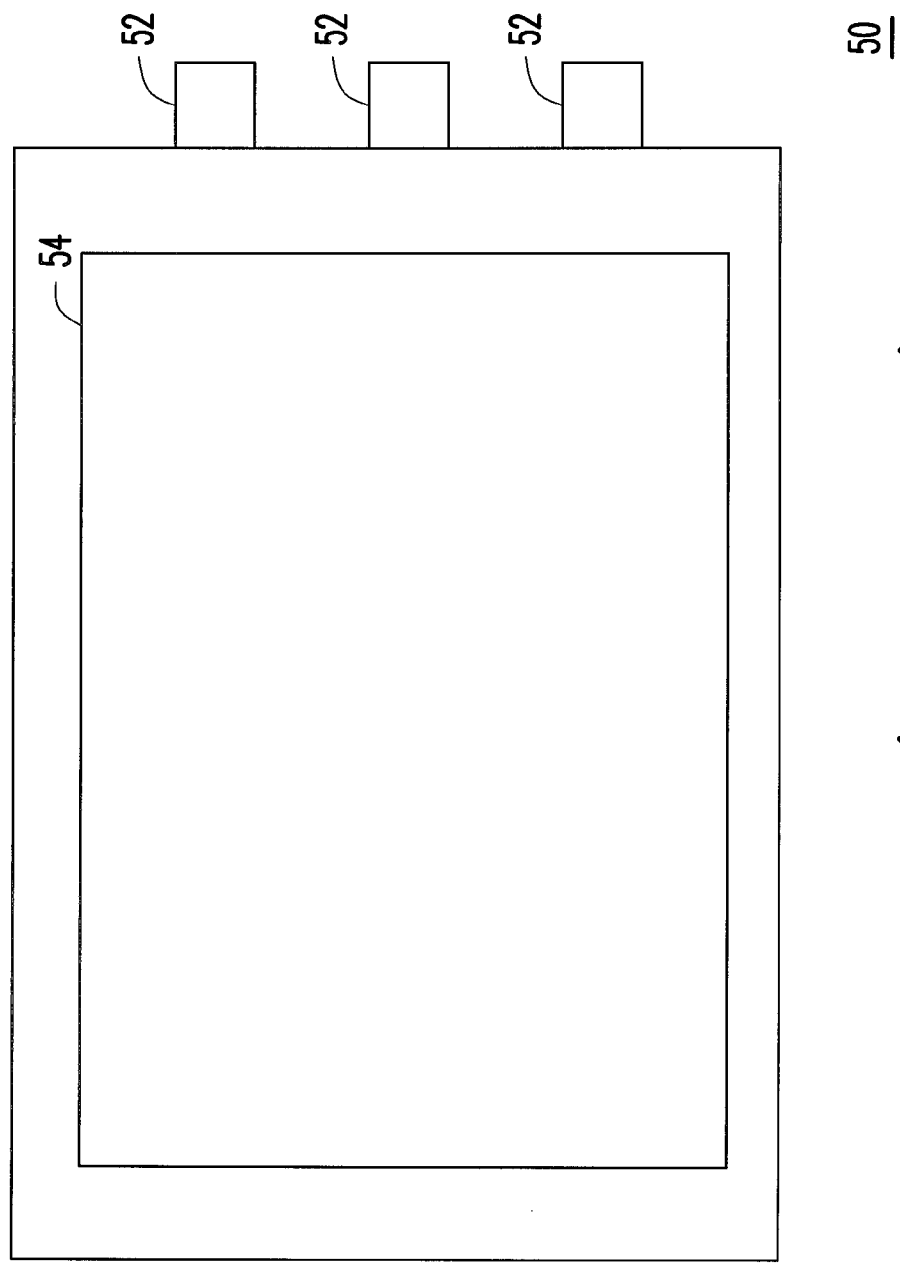
FIG. 1 is a block diagram schematically illustrating a conventional packaged IC chip.
Figure 2:
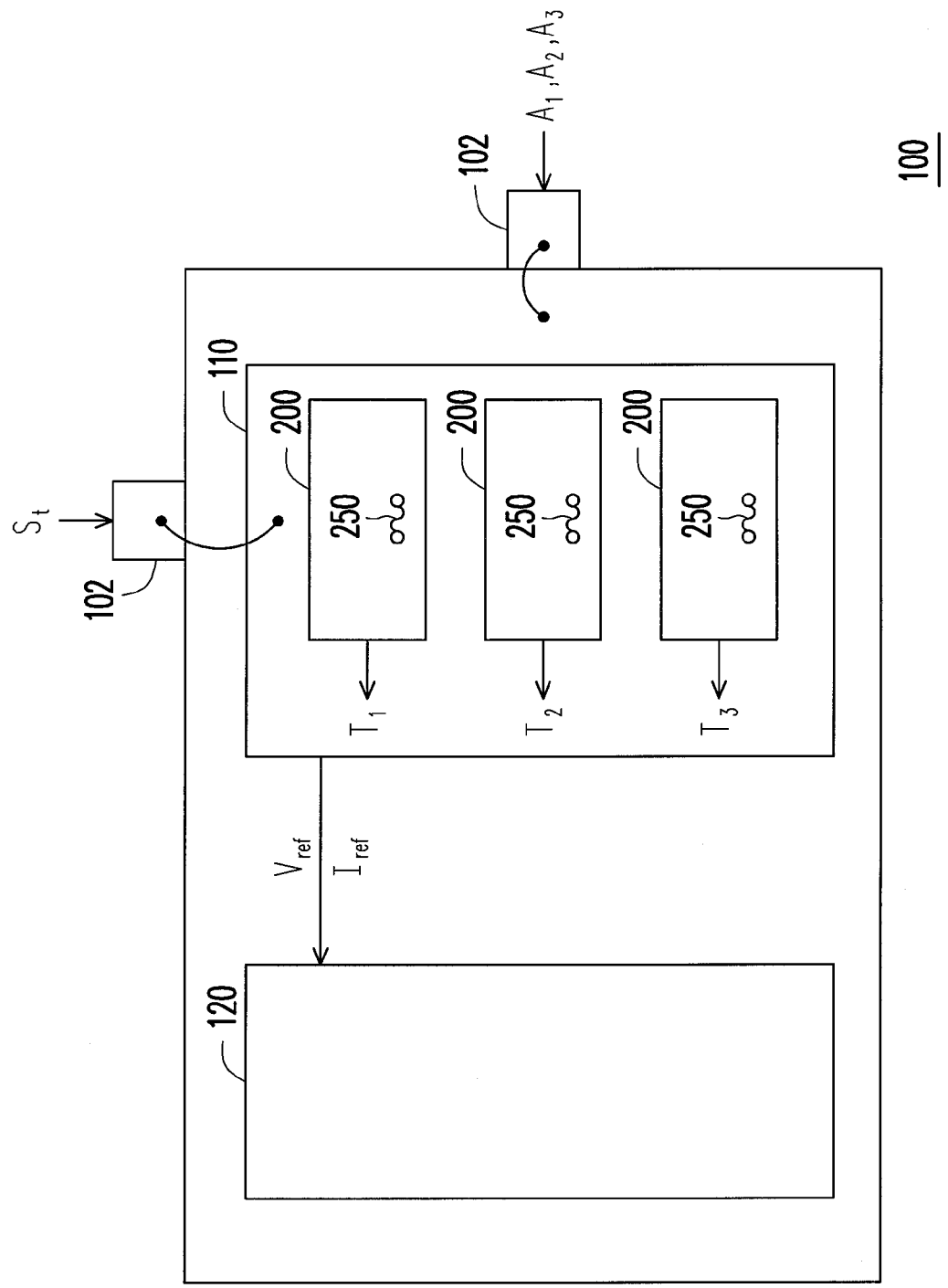
FIG. 2 is block diagram of a packaged IC chip having a trimming circuit according to an embodiment of the present invention.

The present invention provides a trimming circuit for trimming an electric apparatus. The trimmed electric apparatus could be, for example, an integrated circuit, a circuit board, or a packaged IC chip. The trimming circuit could be a part of the electric apparatus to be trimmed or independent of the electric apparatus. The trimming circuit comprises at least a trimming cell. Please refer to FIG. 2. FIG. 2 is a block diagram of packaged IC chip 100 having a trimming circuit 110 according to an embodiment of the present invention. The packaged IC chip 100 includes the trimming circuit 110 and a core circuit 120. The trimming circuit 110 is used to trim the core circuit 120 according to the input signals $A_1$-$A_3$ and a trimming control signal $S_t$. The input signals $A_1$-$A_3$ and the trimming control signal $S_t$ are transmitted to the trimming circuit 110 via the pads 102 of the packaged IC chip 100. The trimming circuit 110 includes three trimming cells 200 for outputting output signals $T_1$-$T_3$. The trimming circuit 110 provides a trimming voltage $V_{ref}$ or a trimming current $I_{ref}$ to the core circuit 120. It should be noted that the quantity of the trimming cells 200 could be any positive integer. For example, in an embodiment of the present invention, the trimming circuit 110 includes a single trimming cell 200. Moreover, in another embodiment of the present invention, the trimming circuit 110 includes two or more than two trimming cells 200. Additionally, in the embodiment, the input signals $A_1$-$A_3$ are transmitted to the trimming circuit 110 via a single pad 102 sequentially. However, in another embodiment of the present invention, the input signals $A_1$-$A_3$ could be transmitted to the trimming circuit 110 via different pads 102 respectively.

In the embodiment, there is a fuse 250 in each of the trimming cells 200. When receiving the trimming control signal $S_t$ at an enable state and the input signal $A_X$ at a first state, whether the parameter X is 1, 2 or 3, the fuse 250 in the corresponding trimming cell will be blown. In other words, when the input signal $A_X$ is at the first state, the trimming control signal $S_t$ is used to blow the fuse 250 of the corresponding trimming cell 200. On the contrary, when the trimming control signal $S_t$ is at a disable state, the fuses 250 are protected from being blown. Moreover, if a fuse 250 has not been blown, the state of the corresponding output voltage $T_X$ is the same as that of the corresponding input signal $S_t$. And when the fuse 250 is blown, the state of the corresponding output voltage $T_X$ is at the first state. More descriptions about the operations of the trimming cells 200 would be recited below.

In the embodiment, the input signals $A_1$-$A_3$ are digital signals. Each of the input signals $A_1$-$A_3$ includes a one-bit code for controlling the corresponding trimming cell 200.

During trimming the core circuit 120, the bits of the input signals $A_1$-$A_3$ are changed stepwise. For example, the codes of the input signals $A_1$-$A_3$ may be sequentially changed to "000", "001", "010", "011", "100", "101", "110" and "111". In the embodiment, if the code of one of the input signals $A_1$-$A_3$ is "1", it means that corresponding input signal is at the first state. If the code of one of the input signals $A_1$-$A_3$ is "0", it means that corresponding input signal is at the second state. While changing the codes of the input signals $A_1$-$A_3$, the trimming voltage $V_{ref}$ or the trimming current $I_{ref}$ is adjusted accordingly. Therefore, a desired value of the trimming voltage $V_{ref}$ or of the trimming current $I_{ref}$ could be determined by sequentially changing the codes of the input signals $A_1$-$A_3$ before blowing the fuses 250 of the trimming cells 200.

The codes of the input signals $A_1$-$A_3$ are inputted to the trimming cells 200 corresponding to the desired value of the trimming voltage $V_{ref}$ or to the determined trimming current $I_{ref}$, and the trimming control signal St is changed from the disable state to the enable state, such that the selected fuses 250 are (or a single selected fuse 250 in some cases) blown according to the codes (or states) of the input signals $A_1$-$A_3$ and that the trimming voltage $V_{ref}$ or the trimming current $I_{ref}$ may be adjusted to the desired value. After the selected fuses 250 are (or a single selected fuse 250 in some cases) blown according to the codes of the input signals $A_1$-$A_3$, the operation of trimming the core circuit 120 is accomplished. In an embodiment, while finishing the operation of trimming the core circuit 120, the codes of the input signals $A_1$-$A_3$ are maintained to be "000".

Figure 3:
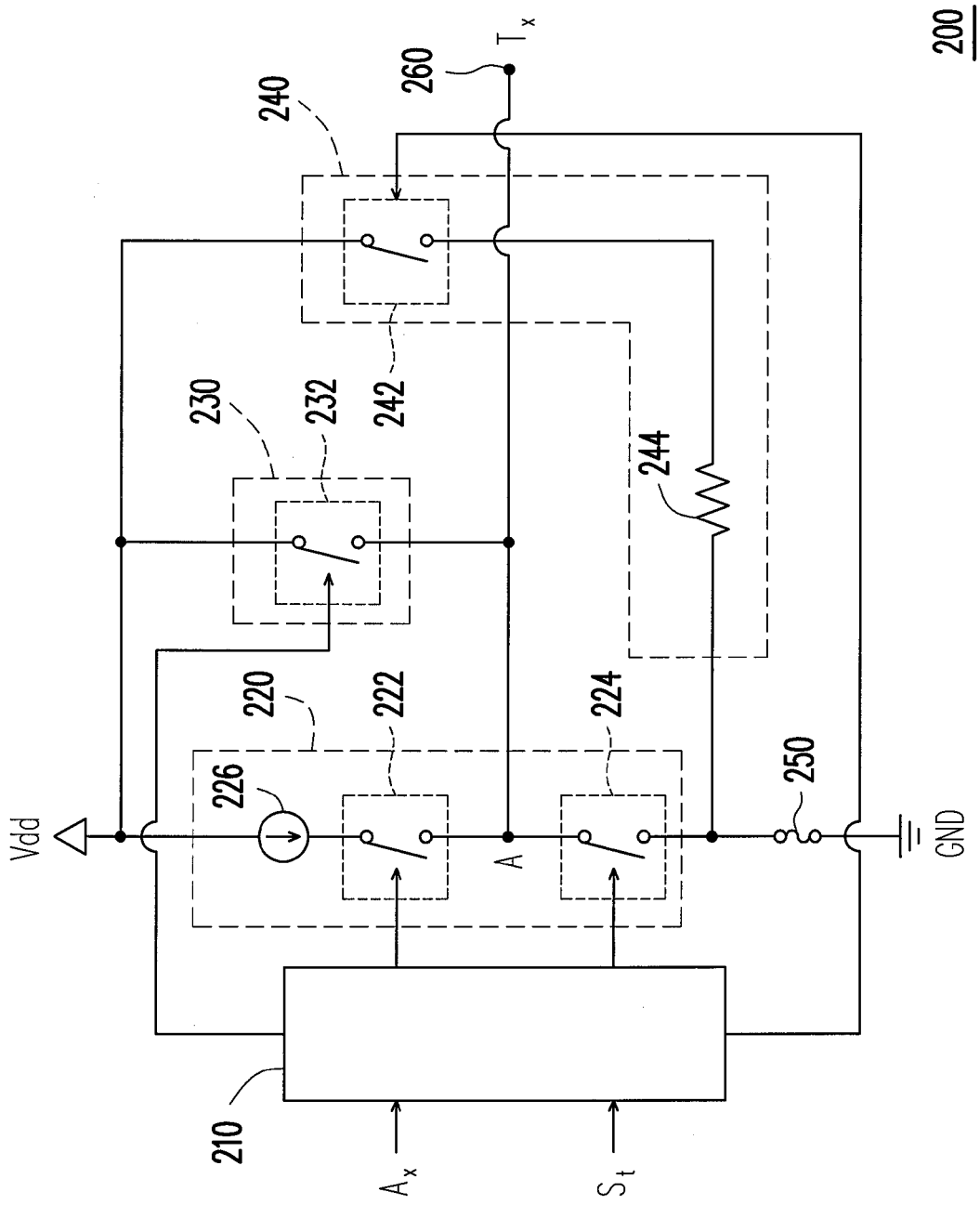
FIG. 3 is a block diagram of a trimming cell of the trimming circuit of an embodiment of the present invention.

Please refer to FIG. 3. FIG. 3 is a block diagram of a trimming cell 200 of the trimming circuit of an embodiment of the present invention. In each of the trimming cells 200, there are a driving unit 210, first current path 220, a second current path 230, a third current path 240 and the fuse 250. The first current path 220 and the third current path 240 are both coupled between a system voltage Vdd and the fuse 250. The first current path 220 has a first switch 222 and a second switch 224. The first switch 222 and the second switch 224 are coupled in series. The second current path 230 is coupled between the system voltage Vdd and a connection node A of the first switch 222 and the second switch 224. The third current path 240 has a fourth switch 242.

The input signal $A_X$ and the trimming control signal $S_t$ are input to the driving unit 210 for controlling the operations of the switches 222, 224, 232 and 242. The switching statuses of the first switch 222, the second switch 224, the third switch 232 are changed in response to the variations of the input signal $A_X$, and the switching status of the fourth switch 242 is changed in response to the variations of the input signal $A_X$ and the trimming control signal $S_t$. The input signal $A_X$ varies from a first state to a second state or from the second state to the first state. Similarly, the trimming control signal $S_t$ varies from the disable state to the enable state or from the enable state to the disable state. In one embodiment of the present invention, the voltage level of the input signal $A_X$ is high for the first state and low for the second state, or alternately. The voltage level of the trimming control signal $S_t$ is high for the disable state and low for the enable state, or alternately. However, the present invention is not limited thereto.

Figure 4:
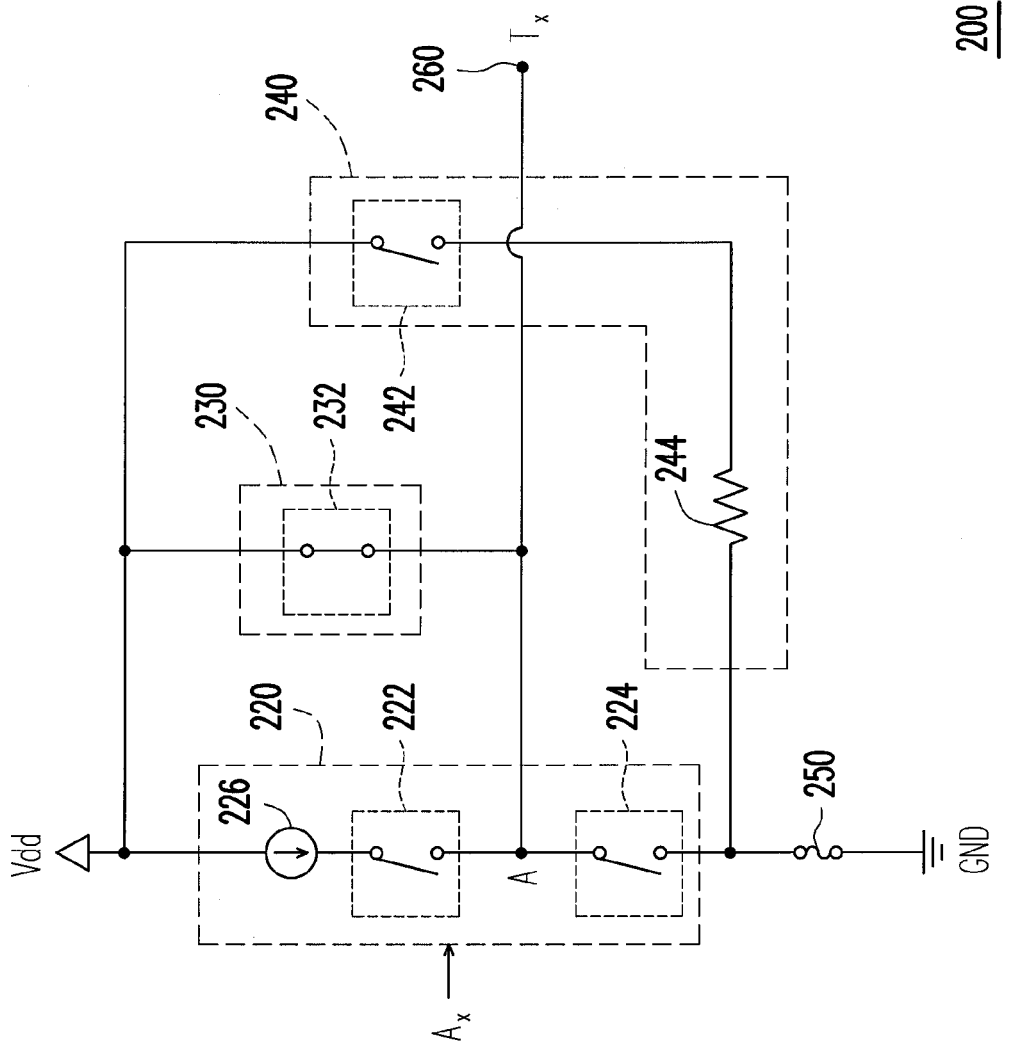
FIG. 4 is a block diagram of the trimming cell when an input signal is at a first state and a trimming control signal is at a disable state.

Please refer to FIG. 4. FIG. 4 is a block diagram of the trimming cell 200 with the input signal $A_X$ being at the first state and the trimming control signal $S_t$ at the disable state. According to the present embodiment, when the input signal $A_X$ is at the first state, the first switch 222 and the second switch 224 are turned off, and the third switch 232 is turned on. Therefore, the first current path 220 is interrupted, and the second current path 230 is conducted. Moreover, since the trimming control signal $S_t$ is at the disable state, the fourth switch 242 is also turned off, such that the third current path 240 is interrupted. Because the second current path 230 is conducted through, an output terminal 260 of the trimming cell 200 is coupled to the system voltage Vdd, and an output voltage $T_X$ from the output terminal 260 is high (i.e. at the first state). It is concluded that, in the present embodiment shown in FIG. 4, when the input signal $A_X$ is at the first state and the trimming control signal $S_t$ is at the disable state, the output voltage $T_X$ is at the first state.

Figure 5:
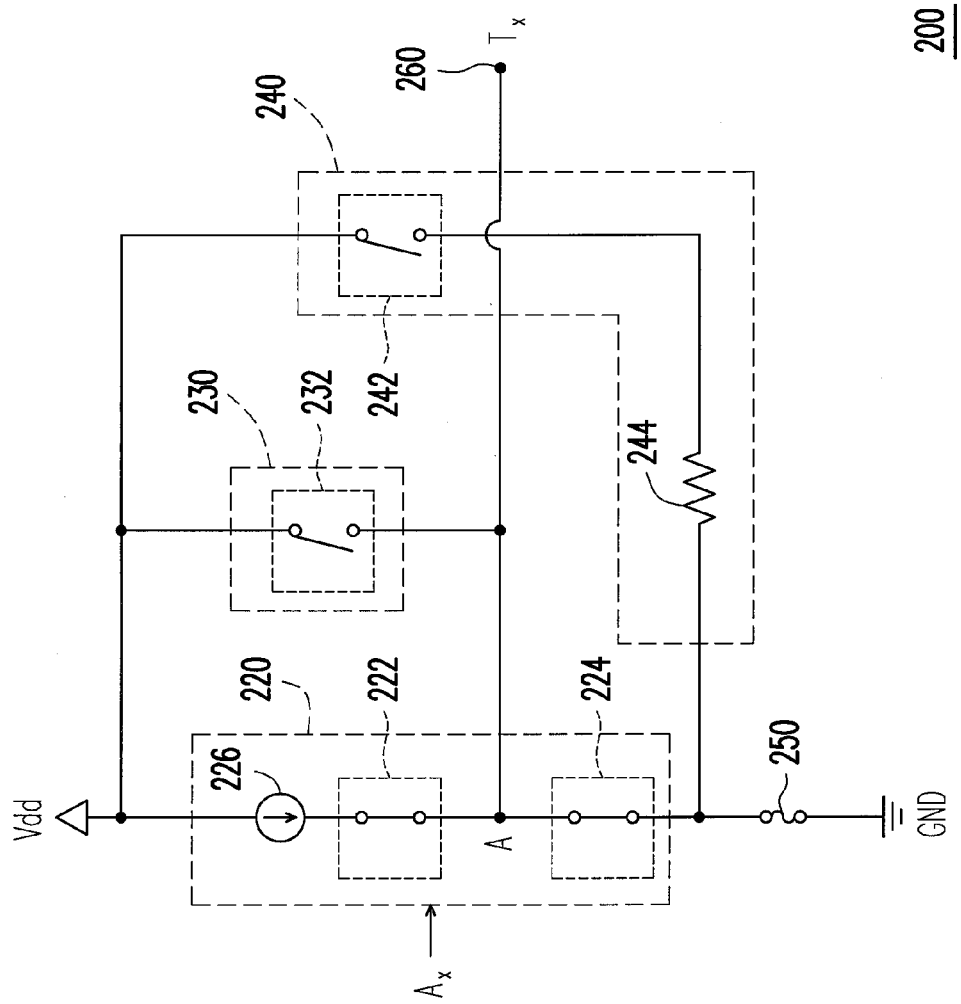
FIG. 5 is a block diagram of the trimming cell when the input signal is at a second state and the trimming control signal is at the disable state.

Please refer to FIG. 5. FIG. 5 is a block diagram of the trimming cell 200 with the input signal $A_X$ being at the second state and the trimming control signal $S_t$ at the disable state. When the input signal $A_X$ is at the second state, the first switch 222 and the second switch 224 are turned on, and the third switch 232 is turned off. Therefore, the first current path 220 is conducted, and the second current path 230 is interrupted. When the trimming control signal $S_t$ is at the disable state, the fourth switch 242 is turned off, such that the third current path 240 is interrupted. Since the first current path 220 is conducted, the current $I_1$ of the current source 226 flows through the first switch 222, the second switch 224 and the fuse 250. The current $I_1$ of the current source 226 is slight and the fuse 250 would not be blown by the current $I_1$ flowing through the first switch 222. Moreover, because the impedance of the current source 226 is excessively greater than that of the fuse 250, the output voltage $T_X$ is dropped low (i.e. at the second state). It is concluded that, in the present embodiment shown in FIG. 5, when the input signal $A_X$ is at the second state and the trimming control signal $S_t$ is at the disable state, the output voltage $T_X$ is at the second state.

Figure 6:
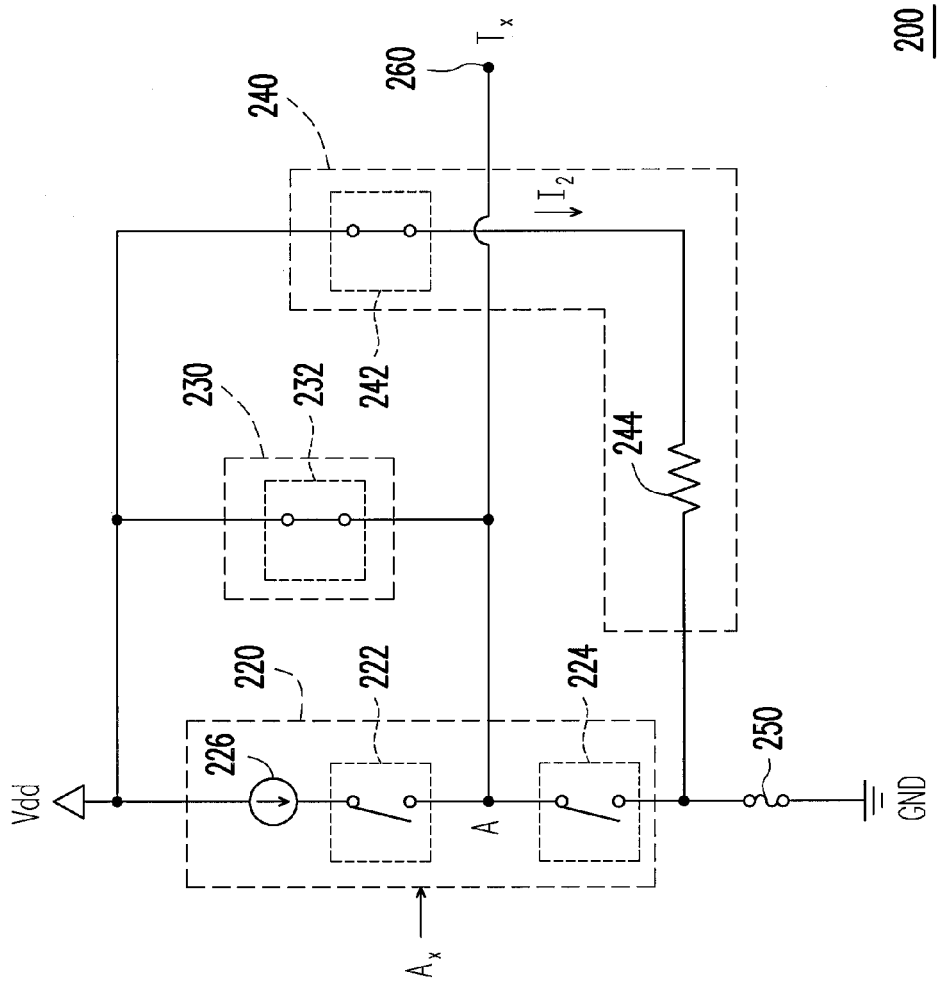
FIG. 6 is a block diagram of the trimming cell when the input signal is at the first state and the trimming control signal is at an enable state.

Please refer to FIG. 6. FIG. 6 is a block diagram of the trimming cell 200, with the input signal $A_X$ being at the first state and the trimming control signal $S_t$ at the enable state. As shown in FIG. 6, when the input signal $A_X$ is at the first state, the first switch 222 and the second switch 224 are turned off, and the third switch 232 is turned on. Therefore, the first current path 220 is interrupted, and the second current path 230 is conducted. When the trimming control signal $S_t$ is at the enable state and the input signal $A_X$ is at the first state, the fourth switch 242 is turned on, such that the third current path 240 is conducted. Since the third current path 240 is conducted, a current $I_2$ flows from the system voltage Vdd through the resistor 244 and the fuse 250 to the ground GND. The current $I_2$ is great enough to blow the fuse 250. Therefore, when the trimming control signal $S_t$ is changed from the disable state to the enable state while the input signal $A_X$ is at the first state, the fuse 250 would be blown due to the current $I_2$.

Figure 7:
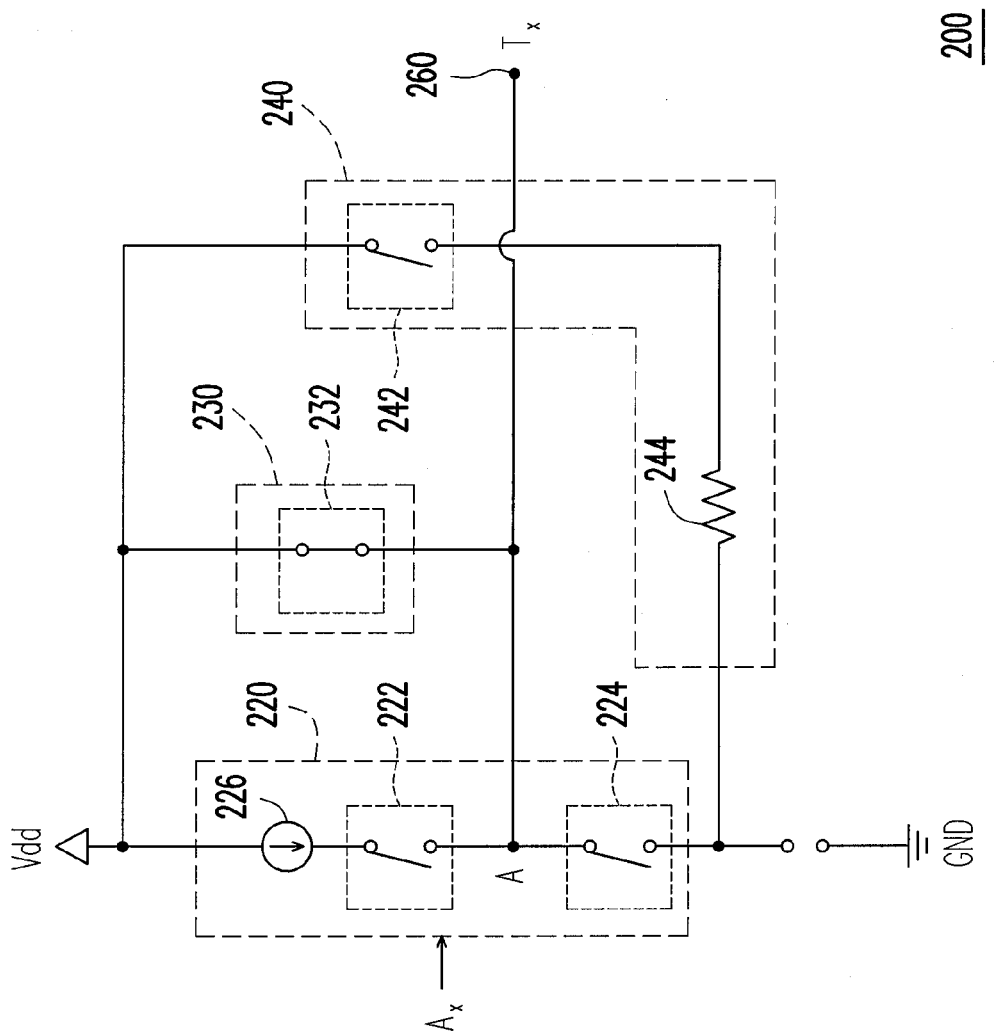
FIG. 7 is a block diagram of the trimming cell when the fuse is blown.

Please refer to FIG. 7. FIG. 7 is a block diagram of the trimming cell 200 with the fuse 250 being blown. One of the first current path 220 and the second current path 230 is interrupted, and the output terminal 260 of the trimming cell 200 is coupled to the system voltage Vdd. For example, the first current path 220 may be interrupted and the second current path 230 connected, as illustrated in FIG. 7. Alternately, it may be the second current path 230 interrupted and the first current path 220 connected in other embodiments. Since the fuse 250 is blown, the output terminal 260 of the trimming cell 200 is disconnected from the ground GND and coupled to the system voltage Vdd via one of the two current paths 220 and 230. Therefore, the output voltage $T_X$ is high (i.e. at the first state) with the fuse 250 is blown.

Figure 8:
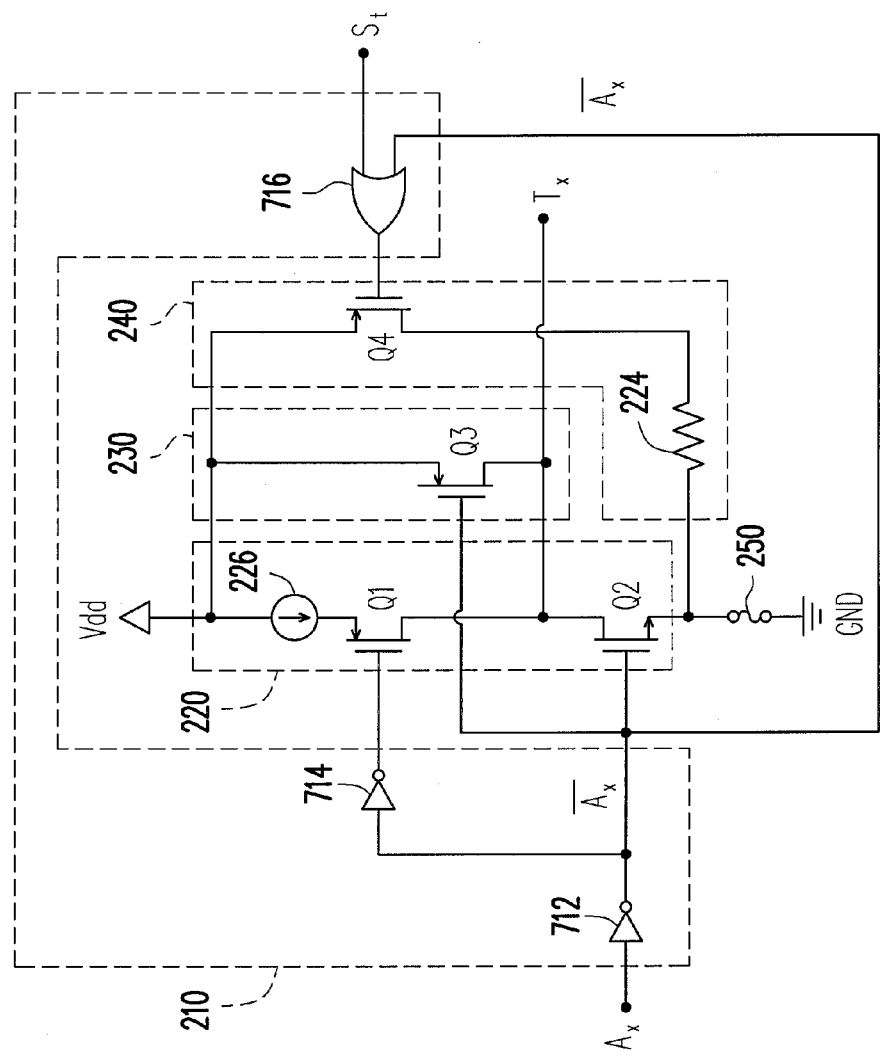
FIG. 8 is a circuit diagram of a trimming cell according to another embodiment of the present invention.

Please refer to FIG. 8. FIG. 8 is a circuit diagram of a trimming cell 200 according to another embodiment of the present invention. The driving unit 210 of the trimming cell 200 includes a first inverter 712, a second inverter 714 and a NOR gate 716. The first current path 220 of the trimming cell 200 includes a current source 226, a first switch Q1 and a second switch Q2. The second current path 230 of the trimming cell 200 includes a third switch Q3, and the third current path 240 of the trimming cell 200 includes a fourth switch Q4. In the embodiment, each of the first switch Q1, the third switch Q3 and the fourth switch Q4 is a PMOS transistor, and the second switch Q2 is an NMOS transistor. The first inverter 712 receives the input signal $A_X$, and the output terminal of the first inverter 712 is coupled to the input terminal of the second inverter 714, the second switch Q2 and the third switch Q3. An output terminal of the second inverter 714 is coupled to the first switch Q1, and two input terminals of the NOR gate 716 receive the trimming control signal $S_t$ and the inverted input signal $\overline{A_X}$ respectively. An output terminal of the NOR gate 716 is coupled to the fourth switch Q4. Therefore, when the input signal $A_X$ is high (i.e. at the first state), the first switch Q1 and the second switch Q2 are turned off, and the third switch Q3 is turned on. When the input signal $A_X$ is low (i.e. at the first state), the first switch Q1 and the second switch Q2 are turned on, and the third switch Q3 is turned off. When the input signal $A_X$ is high (i.e. at the first state) and the trimming control signal $S_t$ is low (i.e. at an enable state), the fourth switch Q4 is turned on to blow the fuse 250.

Figure 9:
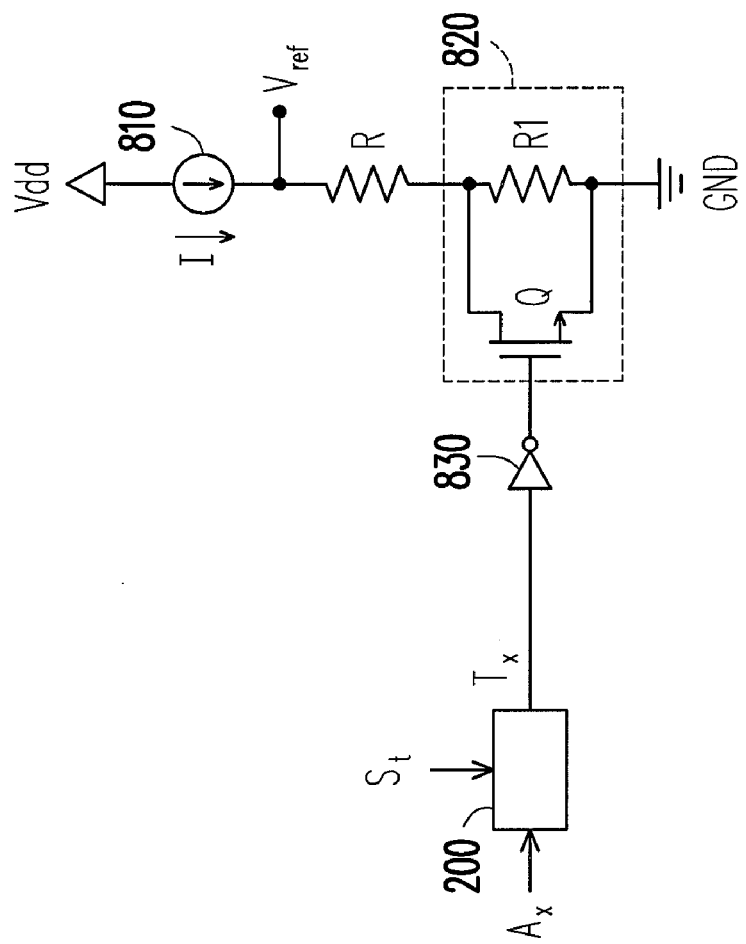
FIGS. 9-17 are circuit diagrams of different trimming circuits according to the embodiments of the present invention.

Please refer to FIG. 9. FIG. 9 is a circuit diagram of a trimming circuit 800 of an embodiment of the present invention. The trimming circuit 800 includes the trimming cell 200, a current source 810, a resistor R, a voltage adjuster 820, and an inverter 830. It is provided the trimming voltage $V_{ref}$ to the trimming circuit 800, and the trimming voltage $V_{ref}$ is adjustable based on the output voltage $T_X$ of the trimming cell 200. When the output voltage $T_X$ is high, a transistor Q of the voltage adjuster 820 is turned off, such that a current I of the current source 810 flows through the resistor R and a resistor R1 of the voltage adjuster 820. Therefore, the trimming voltage $V_{ref}$ is pulled to [I×(R+R1)]. When the output voltage $T_X$ is low, the transistor Q is turned on, such that the current I flows through the resistor R and the transistor Q. Therefore, the trimming voltage $V_{ref}$ is substantially pulled to (I×R). Accordingly, the trimming voltage $V_{ref}$ is set [I×(R+R1)] or (I×R) according to the voltage level of the output voltage $T_X$.

Figure 10:
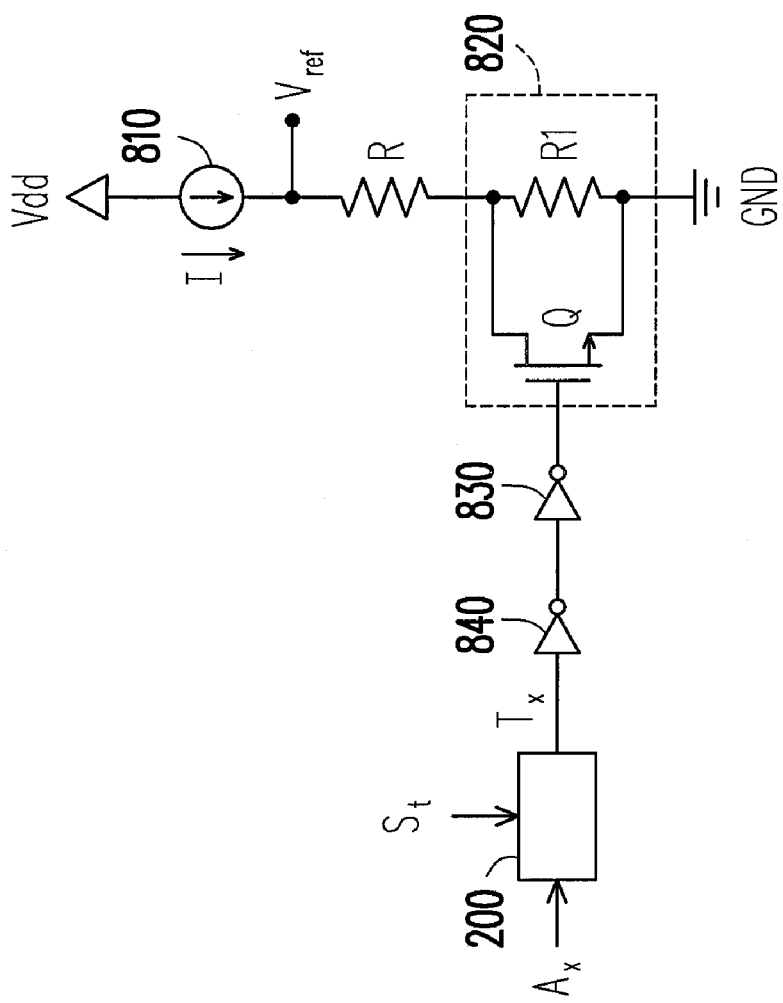

Please refer to FIG. 10. FIG. 10 is a circuit diagram of a trimming circuit 900 of an embodiment of the present invention. As compared with the trimming circuit 800, the trimming circuit 900 further comprises an inverter 840 coupled between the trimming cell 200 and the inverter 830. Therefore, when the output voltage $T_X$ is high, a transistor Q of the voltage adjuster 820 is turned on, such that a current I of the current source 810 flows through the resistor R and the transistor Q. Therefore, the trimming voltage $V_{ref}$ is substantially pulled to (I×R). When the output voltage $T_X$ is low, the transistor Q is turned off, such that the current I flows through the resistors R and R1. Therefore, the trimming voltage $V_{ref}$ is pulled to [I×(R+R1)]. In this embodiment, if the fuse 250 of the trimming cell 200 has not been blown, the output voltage $T_X$ is low, such that the trimming voltage $V_{ref}$ is originally set [I×(R+R1)]. When the fuse 250 of the trimming cell 200 is blown, the output voltage $T_X$ is high, such that the trimming voltage $V_{ref}$ is adjusted from [I×(R+R1)] to (I×R). In other words, the trimming voltage $V_{ref}$ is originally set [I×(R+R1)] and could be adjusted to (I×R).

Figure 11:
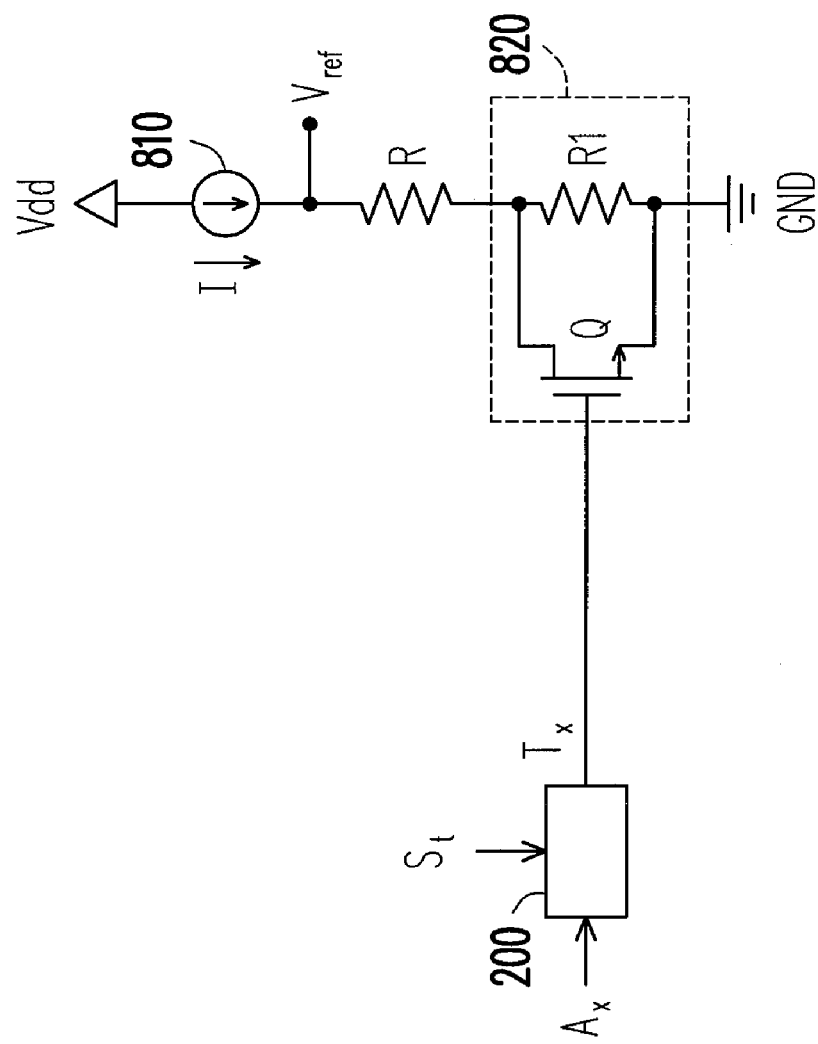

Please refer to FIG. 11. FIG. 11 is a circuit diagram of a trimming circuit 1000 of an embodiment of the present invention. The function of the trimming circuit 1000 is the same as that of the trimming circuit 900 while the trimming circuit 1000 operates without the two inverters 830 and 840. The output terminal of the trimming cell 200 of the trimming circuit 1000 is directly coupled to the transistor Q, such that the transistor may be turned on/off based the output voltage $T_X$ directly.

Figure 12:
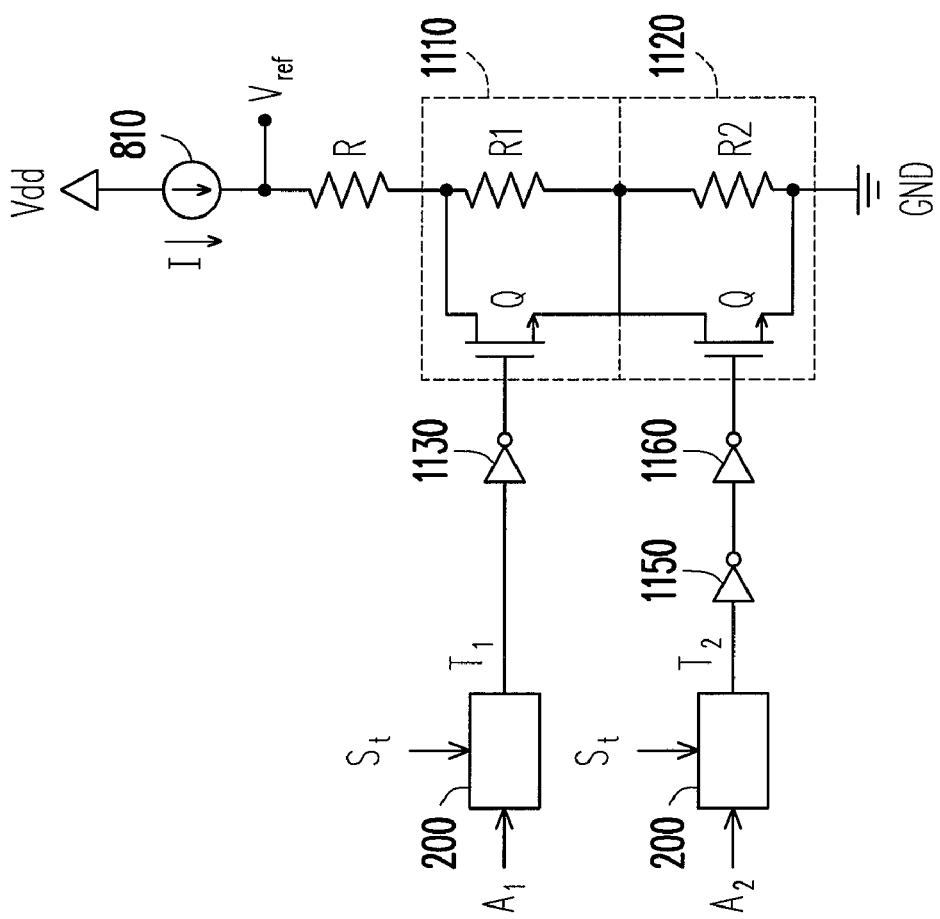

Please refer to FIG. 12. FIG. 12 is a circuit diagram of the trimming circuit 1100 of an embodiment of the present invention. The trimming circuit 1100 comprises two trimming cells 200, the current source 810, the resistor R, two voltage adjusters 1110 and 1120, and three inverters 1130, 1140 and 1150. The two voltage adjusters 1110 and 1120 are cascaded. Each of the voltage adjusters 1110 and 1120 includes a transistor Q and a resistor, R1 or R2, respectively. The trimming voltage $V_{ref}$ is adjustable and determined according to the states of the output voltages $T_1$ and $T_2$. When the output voltages $T_1$ and $T_2$ of the two trimming cells 200 are both low, the transistor Q of the voltage adjuster 1110 is turned on, and the transistor Q of the voltage adjuster 1120 is turned off, such that the trimming voltage $V_{ref}$ is pulled to [I×(R+R2)]. When the output voltage $T_1$ is high and the output voltage $T_2$ is low, the transistors Q of the two voltage adjusters 1110 are turned off, such that the trimming voltage $V_{ref}$ is pulled to [I×(R+R1+R2)]. When the output voltage $T_1$ is low and the output voltage $T_2$ is high, the transistors Q of the two voltage adjusters 1110 are turned on, such that the trimming voltage $V_{ref}$ is pulled to (I×R). When the output voltages $T_1$ and $T_2$ of the two trimming cells 200 are both high, the transistor Q of the voltage adjuster 1110 is turned off, and the transistor Q of the voltage adjuster 1120 is turned on, such that the trimming voltage $V_{ref}$ is pulled to [I×(R+R1)]. Therefore, the trimming voltage $V_{ref}$ is originally set [I×(R+R2)] and could be adjusted to (I×R), [I×(R+R2)], or [I×(R+R1+R2)] based on the voltage levels of the output voltages $T_1$ and $T_2$ of the two trimming cells 200. Accordingly, if the resistance of the resistor R1 is greater than that of the resistor R2, after the trimming operation, the trimming voltage $V_{ref}$ could be increased from [I×(R+R2)] to [I×(R+R1+R2)] or to [I×(R+R1)], or decreased from [I×(R+R2)] to (I×R), etc.

Figure 13:
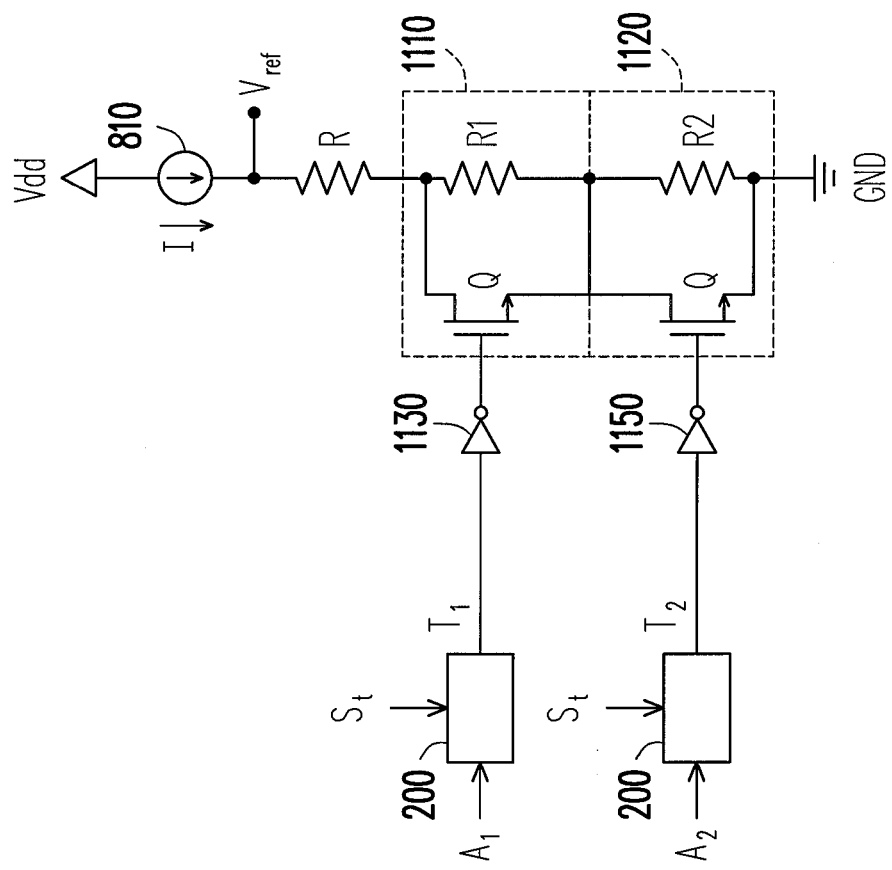

Please refer to FIG. 13. FIG. 13 is a circuit diagram of a trimming circuit 1200 of an embodiment of the present invention. As compared with trimming circuit 1100 illustrated in FIG. 12 and described above, the trimming circuit 1200 operates without adopting the inverter 1160. When the output voltages $T_1$ and $T_2$ of the two trimming cells 200 are both low, the trimming voltage $V_{ref}$ is equal to (I×R). When the output voltage $T_1$ is high and the output voltage $T_2$ is low, the trimming voltage $V_{ref}$ is equal to [I×(R+R2)]. When the output voltage $T_1$ is low and the output voltage $T_2$ is high, the trimming voltage $V_{ref}$ is equal to [I×(R+R1)]. When the output voltages $T_1$ and $T_2$ of the two trimming cells 200 are both high, the trimming voltage $V_{ref}$ is pulled to [I×(R+R1+R2)]. Therefore, in this embodiment, the trimming voltage $V_{ref}$ is originally set (I×R) and could be adjusted to [I×(R+R1)], [I×(R+R2)], or [I×(R+R1+R2)].

Figure 14:
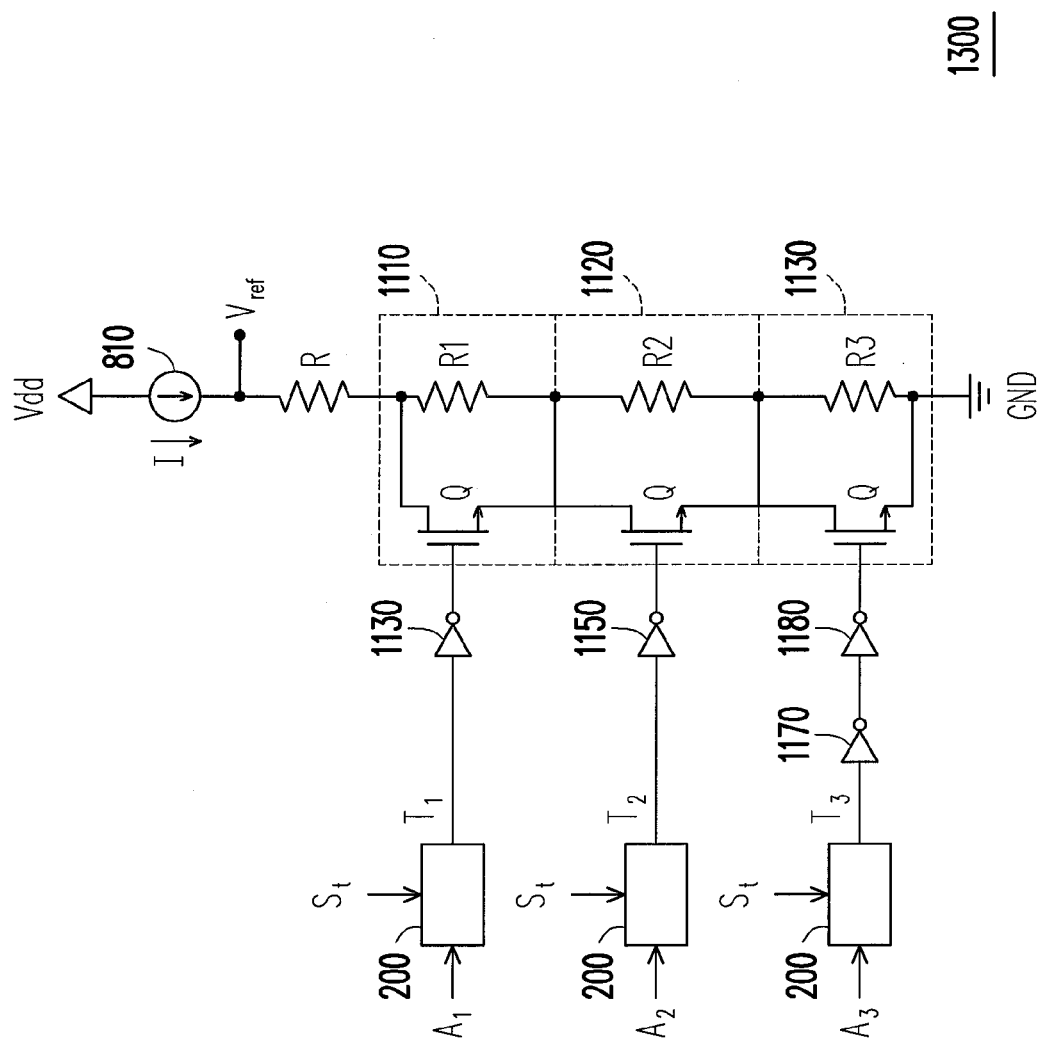

Please refer to FIG. 14. FIG. 14 is a circuit diagram of a trimming circuit 1300 of an embodiment of the present invention. The trimming circuit 1300 comprises three trimming cells 200, the current source 810, the resistor R, three voltage adjusters 1110, 1120 and 1130, and four inverters 1130, 1150, 1170 and 1180. The three voltage adjusters 1110, 1120 and 1130 are cascaded. Each of the voltage adjusters, 1110, 1120 and 1130 includes a transistor Q and a resistor, R1, R2 or R3, respectively. The trimming voltage $V_{ref}$ is adjustable and determined according to the states of the output voltages of the three trimming cells 200 $T_1$, $T_2$ and $T_3$. In the embodiment, the trimming voltage $V_{ref}$ is originally set [I×(R+R3)]

and could be adjusted to (I×R), [I×(R+R1)], [I×(R+R2)], [I×(R+R1+R2)], [I×(R+R1+R3)], [I×(R+R2+R3)] or [I×(R+R1+R2+R3)].

Figure 15:
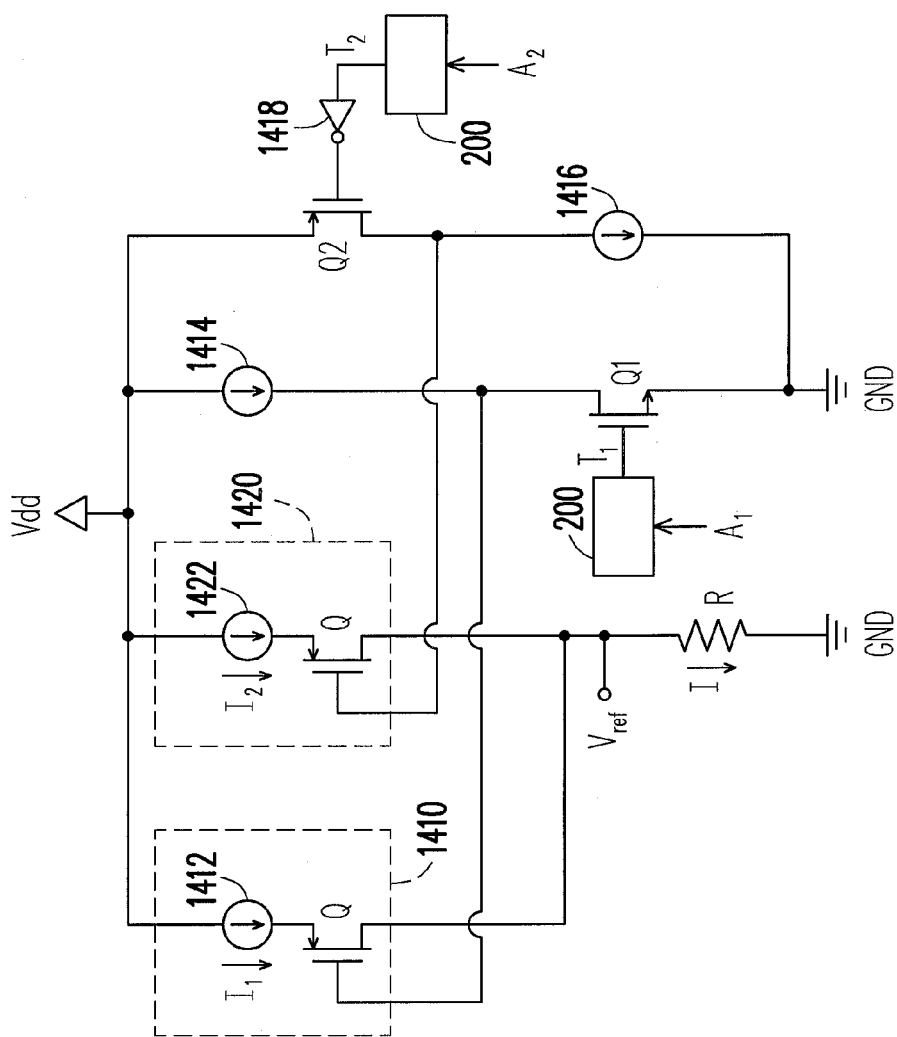

Please refer to FIG. 15. FIG. 15 is a trimming circuit 1400 of an embodiment of the present invention. The trimming circuit 1400 includes the trimming cells 200, two adjusters 1410 and 1420, and a resistor R. Each of the adjusters 1410 and 1420 includes a first current source 1412 or 1422 and a fifth switch Q. In the embodiment, each of the fifth switches Q is a PMOS transistor. The first current sources 1412 and 1422 provide currents $I_1$ and $I_2$ respectively. When one of the fifth switches Q is turned on, the corresponding current $I_1$ or $I_2$ may flow through the resistor R. In other words, the trimming voltage $V_{ref}$ provided by the resistor R may be adjustable by controlling the fifth switches Q. Each of the fifth switches Q is turned on/off in response to the output voltage $T_1$ or $T_2$ of the corresponding trimming cell 200, respectively. In the embodiment illustrated in FIG. 15, the fifth switch Q of the adjuster 1410 is controlled in response to the output voltage $T_1$, and the fifth switch Q of the adjuster 1420 is controlled in response to the output voltage $T_2$. When the output voltage $T_1$ is low, the transistor Q1 is turned off, such that current of the current source 1414 may not flow through the transistor Q1, and that the gate of the transistor Q of the adjuster 1410 is coupled to the system voltage Vdd. Accordingly, the fifth switch Q of the adjuster 1410 is turned off, and the current $I_1$ may not flow through the resistor R. When the output voltage $T_1$ is high, the transistor Q1 is turned on, such that the current of the current source 1414 may flow through the transistor Q1, and that the gate of the transistor Q of the adjuster 1410 is grounded. Accordingly, the fifth switch Q of the adjuster 1410 is turned on, and the current $I_1$ may flow through the resistor R.

Similarly, when the output voltage $T_2$ is low, the transistor Q2 is turned off for the output voltage of the inverter 1418 is high. Therefore, the current of the current source 1416 may not flow from the transistor Q2, and the gate of the transistor Q of the adjuster 1420 is grounded. Accordingly, the fifth switch Q of the adjuster 1420 is turned on, and the current $I_2$ may flow through the resistor R. When the output voltage $T_2$ is high, the transistor Q2 is turned on, such that the current of the current source 1416 may flow from the transistor Q2, and that the gate of the transistor Q of the adjuster 1420 is coupled to the system voltage Vdd. Accordingly, the fifth switch Q of the adjuster 1420 is turned off, and the current $I_2$ may not flow through the resistor R. That is, the current I flowing through the resistor R is determined based on the output voltages $T_1$ and $T_2$. Hence the trimming voltage $V_{ref}$ is pulled to (I×R). The trimming voltage $V_{ref}$ is adjustable and associated with the output voltages $T_1$ and $T_2$ of the trimming cells 200.

Figure 16:
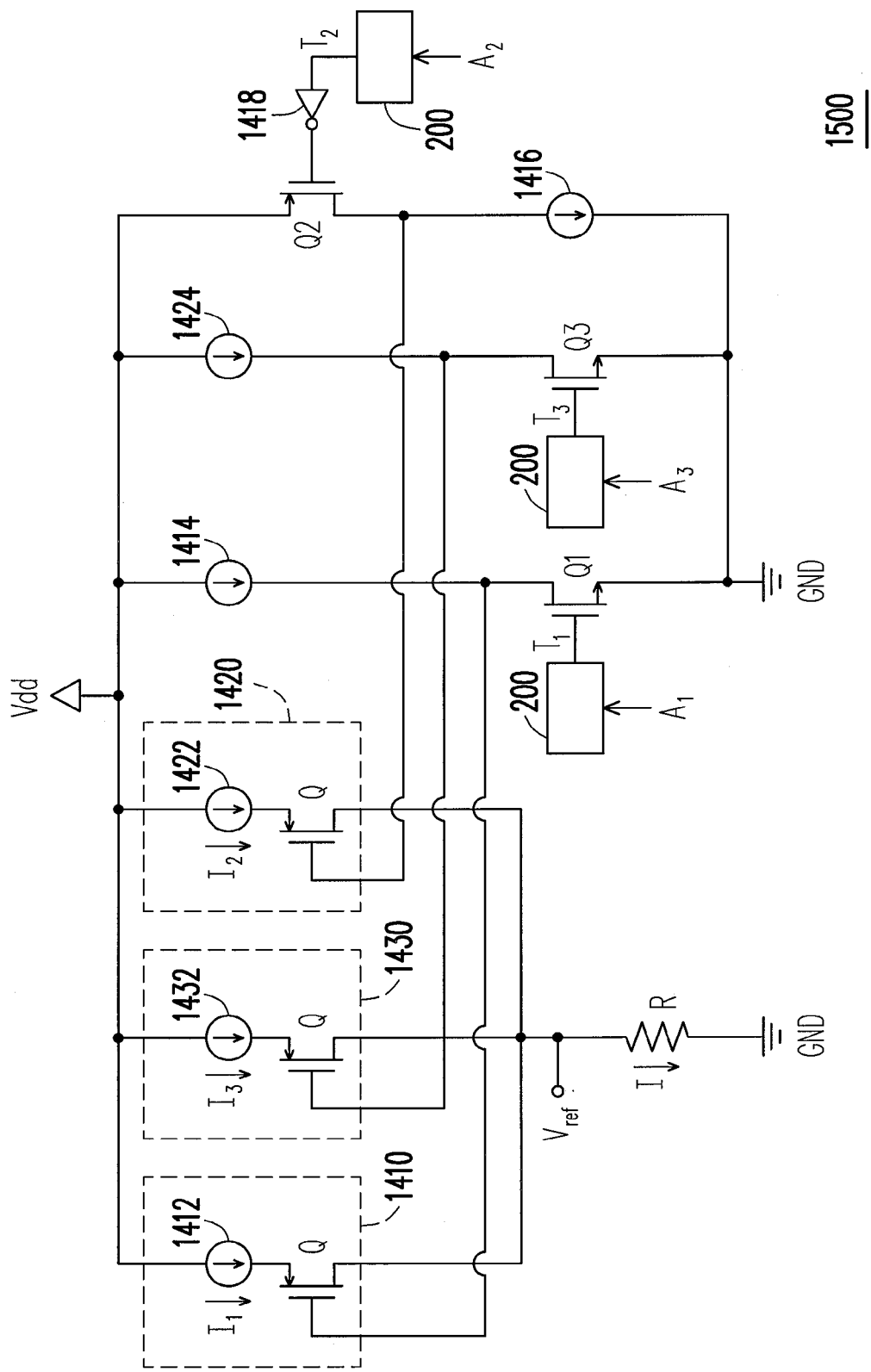

Please refer to FIG. 16. FIG. 16 is a trimming circuit 1500 of an embodiment of the present invention. As compared with the trimming circuit 1400 shown in FIG. 15, the trimming circuit 1500 further comprises another adjuster 1430 and another trimming cell 200 for outputting an output voltage $T_3$. When the output voltage $T_3$ is low, the transistor Q3 is turned off, such that current of the current source 1424 may not flow through the transistor Q3, and that the gate of the transistor Q of the adjuster 1430 is coupled to the system voltage Vdd. Accordingly, the fifth switch Q of the adjuster 1430 is turned off, and the current $I_3$ may not flow through the resistor R. When the output voltage $T_3$ is high, the transistor Q3 is turned on, such that the current of the current source 1424 may flow through the transistor Q3, and that the gate of the transistor Q of the adjuster 1430 is grounded. Accordingly, the fifth switch Q of the adjuster 1430 is turned on, and the current $I_3$ may flow through the resistor R. Therefore, the trimming voltage $V_{ref}$ is adjustable and associated with the output voltages $T_1$, $T_2$ and $T_3$ of the trimming cells 200.

Figure 17:
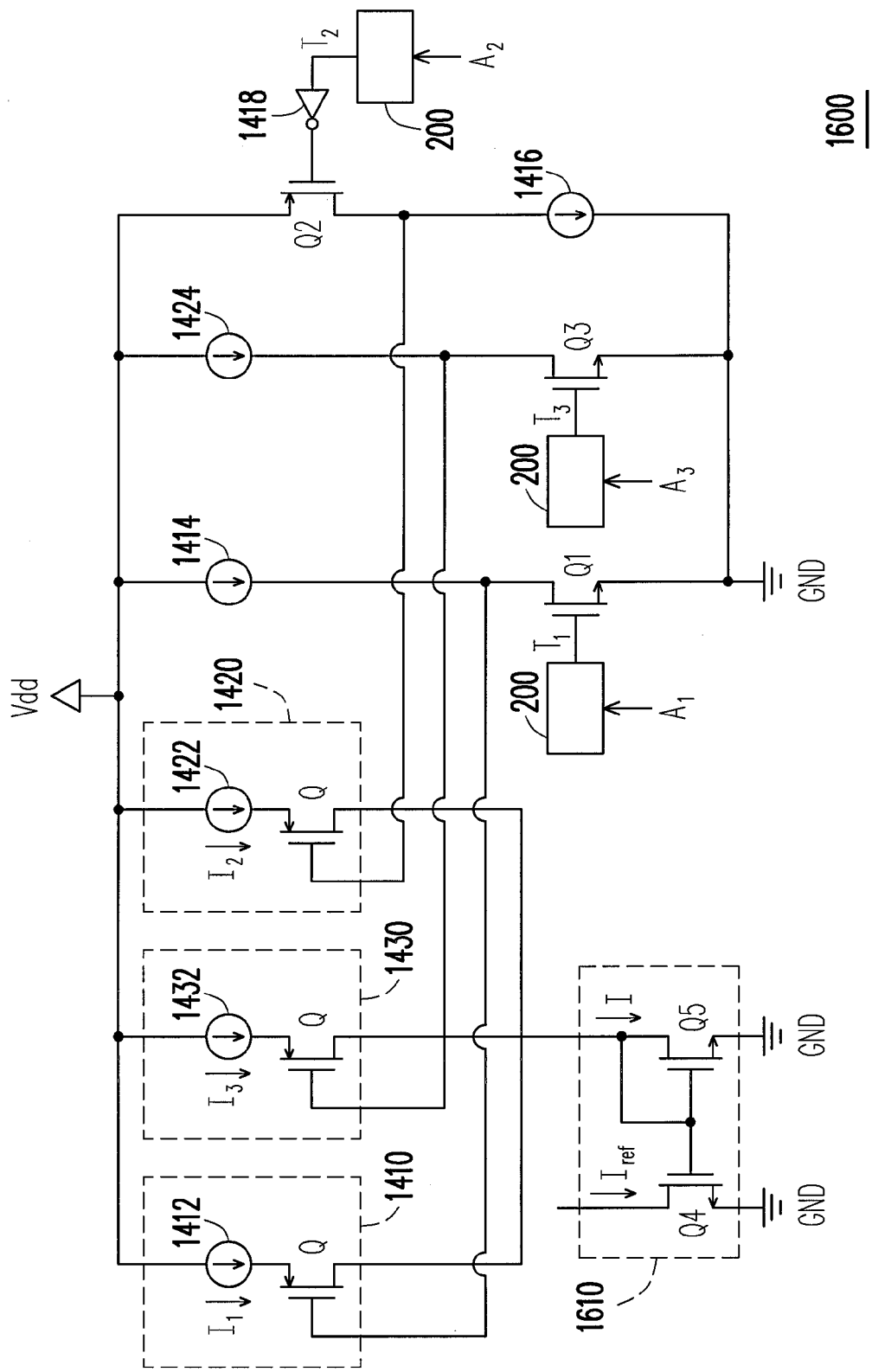

Please refer to FIG. 17. FIG. 17 is a trimming circuit 1600 of an embodiment of the present invention. As compared with the trimming circuit 1500 shown in FIG. 16, the resistor R of the trimming circuit 1500 in the trimming circuit is replaced by a current mirror 1610 in the trimming circuit 1600. The current mirror 1610 is coupled to the adjusters 1412, 1422 and 1432 to provide the trimming current $I_{ref}$. The current mirror 1610 includes two transistors Q4 and Q5. The trimming current $I_{ref}$ is equal to the current I flowing through the transistor Q5, and the current I is adjustable and associated with the output voltages $T_1$, $T_2$ and $T_3$ of the trimming cells 200. This way, the trimming current $I_{ref}$ is adjustable and associated with the output voltages $T_1$, $T_2$ and $T_3$ of the trimming cells 200.

Based on the description above, a desired value of a trimming voltage or a trimming current could be determined previously before trimming a circuit. After the desired value of the trimming voltage or the trimming current is determined, the trimming control signal is used to blow the fuse(s) to fix the trimming voltage or the trimming current to the desired value. Therefore, even if the circuit to be trimmed has been packaged as an IC chip, the electrical characteristics of the circuit to be trimmed could be modified by using the trimming circuit of the present invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A trimming circuit, comprising at least a trimming cell, each of the at least trimming cell including:
    a driving unit, capable of receiving an input signal and a trimming control signal;
    a fuse;
    a first current path including a first switch and a second switch coupled in series, the first current path coupled between a system voltage and the fuse;
    a second current path including a third switch, the second current path coupled between the system voltage and a connection node of the first switch and the second switch of the first current path; and
    a third current path coupled between the system voltage and the fuse;
    wherein the first switch, the second switch and the third switch are turned on/off according to the input signal.

2. The trimming circuit as claimed in claim 1, wherein when the input signal is at a first state, the first switch and the second switch are turned off, and the third switch of the second current path is turned on.

3. The trimming circuit as claimed in claim 2, wherein the third current path includes a fourth switch, and when the input signal is at the first state and the trimming control signal is at an enable state, the fourth switch of the third current path is turned on to blow the fuse.

4. The trimming circuit as claimed in claim 1, wherein when the input signal is at a second state, the first switch and the second switch are turned on, and the third switch is turned off.

5. The trimming circuit as claimed in claim 4, wherein an output terminal of the trimming circuit is coupled to the connection node of the first switch and the second switch of the first current path, a voltage level of the output terminal is at the first state when the input signal is at the first state and the fuse is not blown.

6. The trimming circuit as claimed in claim 4, wherein an output terminal of the trimming circuit is coupled to the connection node of the first switch and the second switch of the first current path, a voltage level of the output terminal is at the second state when the input signal is at the second state and the fuse is not blown.

7. The trimming circuit as claimed in claim 4, wherein an output terminal of the trimming circuit is coupled to the connection node, and a voltage level of the output terminal is at the first state when the fuse is blown.

8. The trimming circuit as claimed in claim 3, wherein the driving unit comprises:
   a second inverter including an input terminal and an output terminal, the output terminal coupled to the first switch;
   a first inverter for receiving the input signal, the first inverter including an output terminal coupled to the input terminal of the second inverter, the second switch and the third switch; and
   a NOR gate including two input terminals for receiving the trimming control signal and the inverted input signal, and an output terminal coupled to the fourth switch.

9. The trimming circuit as claimed in claim 3, wherein each of the first switch, the third switch and the fourth switch is a PMOS transistor, and the second switch is an NMOS transistor.

10. The trimming circuit as claimed in claim 1, wherein the first current path further comprises a current source coupled between the system voltage and the first switch.

11. The trimming circuit as claimed in claim 3, wherein the third current path further comprises a resistor coupled between the fourth switch and the fuse.

12. The trimming circuit as claimed in claim 1, wherein the at least a trimming cell comprises a first trimming cell and a second trimming cell, and the trimming circuit further comprises:
   a current source;
   a first resistor, coupled to the current source to provide a trimming voltage; and
   a plurality of voltage adjusters for adjusting the trimming voltage, the voltage adjusters being cascaded, and each of the voltage adjusters having a second resistor and a transistor coupled to the second resistor in parallel;
   wherein a gate of the transistor of a first voltage adjuster of the voltage adjusters is coupled to an output terminal of the first trimming cell, and a gate of the transistor of a second voltage adjuster of the voltage adjusters is coupled to an output terminal of the second trimming cell.

13. The trimming circuit as claimed in claim 12 further comprising:
   a first inverter, coupled between the output terminal of the first trimming cell and the gate of the transistor of the first voltage adjuster;
   a second inverter; and
   a third inverter, coupled to the second inverter in series;
   wherein the gate of the transistor of the second voltage adjuster of the voltage adjusters is coupled to the output terminal of the second trimming cell via the second inverter and the third inverter.

14. The trimming circuit as claimed in claim 1, wherein the at least a trimming cell comprises a plurality of trimming cells, and the trimming circuit further comprises:
   a plurality of adjusters, each of the adjusters comprising a first current source and a fifth switch, wherein the fifth switch of each of the adjusters is controlled in response to variations of an output voltage of a corresponding one of the trimming cells; and
   a resistor coupled to the adjusters for providing a trimming voltage.

15. The trimming circuit as claimed in claim 14, wherein each of the adjusters is coupled to a second current source and a sixth switch, the second current source is coupled to the sixth switch in series, and the sixth switch is controlled by the output voltage of a corresponding one of the trimming cells, such that a corresponding fifth switch is controlled in response to variations of the output voltage of the corresponding one of the trimming cells.

16. The trimming circuit as claimed in claim 1, wherein the at least a trimming cell comprises a plurality of trimming cells, and the trimming circuit further comprises:
   a plurality of adjusters, each of the adjusters comprising a first current source and a fifth switch, wherein the fifth switch of each of the adjusters is controlled in response to variations of an output voltage of a corresponding one of the trimming cells; and
   a current minor coupled to the adjusters for providing a trimming current;
   wherein the trimming current is adjusted based on a current of the current mirror received form the first current sources.

17. The trimming circuit as claimed in claim 16, wherein each of the adjusters is coupled to a second current source and a sixth switch, the second current source is coupled to the sixth switch in series, and the sixth switch is controlled by the output voltage of a corresponding one of the trimming cells, such that a corresponding fifth switch is controlled in response to variations of the output voltage of the corresponding one of the trimming cells.

* * * * *